(12) United States Patent
Fibranz et al.

(10) Patent No.: US 6,788,606 B2
(45) Date of Patent: Sep. 7, 2004

(54) METHOD AND APPARATUS FOR REFRESHING MEMORY CELLS

(75) Inventors: Heiko Fibranz, München (DE); Helmut Fischer, Oberhaching (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/284,806

(22) Filed: Oct. 31, 2002

(65) Prior Publication Data

US 2003/0081488 A1 May 1, 2003

(30) Foreign Application Priority Data

Oct. 31, 2001 (DE) .......................................... 101 53 754

(51) Int. Cl.$^7$ .............................................. G11C 7/00
(52) U.S. Cl. .................. 365/222; 365/230.06; 365/233
(58) Field of Search .......................... 365/222, 230.06, 365/233, 204, 236, 63, 184, 225.7

(56) References Cited

U.S. PATENT DOCUMENTS

| 5,629,898 A | * | 5/1997 | Idei et al. ................... 365/222 |
| 6,529,433 B2 | * | 3/2003 | Choi .......................... 365/222 |

FOREIGN PATENT DOCUMENTS

EP    0 790 620 A2    8/1997

OTHER PUBLICATIONS

Satoru Takase et al.: "A 1.6–Gbyte/s DRAM with Flexible Mapping Redundancy Technique and Additional Refresh Scheme", *IEEE Journal of Solid–State Circuits*, vol. 34, No. 11, Nov. 1999, pp. 1600–1606.

Youji idei et al.: "Dual–Period Self–Refresh Scheme for Low–Power DRAM's with On–Chip PROM Mode Register", *IEEE Journal of Solid–State Circuits*, vol. 33, No. 2, Feb. 1998, pp. 253–259.

Yasuo Miyamoto et al.: "Study of new refresh method for low data retention current", 1993, p. 5–268.

* cited by examiner

*Primary Examiner*—Gene N. Auduong
(74) *Attorney, Agent, or Firm*—Laurence A. Greenberg; Werner H. Stemer; Gregory L. Mayback

(57) ABSTRACT

In a memory element with a first number of memory cells having a first retention time for holding a content of the memory cells and a second number of memory cells having a second retention time for holding the content of the memory cell, a method for refreshing the memory cells comprises a step of refreshing the first number of memory cells when reaching the first retention time and a step of refreshing the second number of memory cells when reaching the second retention time. An apparatus for refreshing the memory cells of the memory element is provided for refreshing the first number of memory cells when reaching the first retention time, and for refreshing the second number of memory cells when reaching the second retention time.

6 Claims, 2 Drawing Sheets

METHOD AND APPARATUS FOR REFRESHING MEMORY CELLS

BACKGROUND OF THE INVENTION

1. Field of the Invention

The present invention refers to memory cells in a memory element and particularly to a refresh of memory cells in a memory element.

2. Description of the Related Art

In battery-operated devices, dynamic random access memories (DRAM), wherein stored data are often kept in the DRAM, when the device is turned off, are used more and more often. This takes place in the so-called selfrefresh mode. Thereby, a timer is running in the DRAM chip, which regularly supplies impulses by which successively all word lines are activated and all memory cells of each word line are refreshed.

A memory array consists, e.g., of 512 word lines, each of which controls 4096 memory cells. So, for refresh, each memory line and each group of memory cells belonging to a word line, respectively, is read out every 64 ms and the read content is written back into the cells, whereby the memory content is maintained. The cycle time of this operation—in this example 64 ms—is also called retention time. Since about 75% of the energy need in the selfrefresh mode is needed for charging the cells in rewriting, it is generally attempted to increase the cycle time of the refresh.

SUMMARY OF THE INVETION

It is the object of the present invention to provide an improved concept for refreshing memory cells.

The present invention is a method for refreshing a plurality of memory cells in a memory element, wherein a first number of memory cells has a first retention time for holding a content of the memory cell, and wherein a second number of memory cells has a second retention time for holding the content of the memory cell, having:

refreshing the first number of memory cells when reaching the first retention time; and
refreshing the second number of memory cells when reaching the second retention time.

The present invention is an apparatus for refreshing a plurality of memory cells in a memory element, wherein a first number of memory cells has a first retention time for holding a content of each of the first number of memory cells, and wherein a second number of memory cells has a second retention time for holding a content of each of the second number of memory cells. The apparatus is provided for refreshing the first number of memory cells when reaching the first retention time, and for refreshing the second number of memory cells when reaching the second retention time.

Preferred developments are defined in the subclaims.

The present invention makes use of the fact that, due to manufacturing reasons, in a typical memory element only individual memory cells have a short retention time during which their data content is maintained readably, most memory cells, however, can hold their data content much longer (up to 1 s) easily. With reference to the above-mentioned numerical example, therefore only individual memory cells actually have to be refreshed every 64 ms. According to the present invention, a refresh is offered every 64 ms, most memory cells, however, only experience a refresh after a multiple of this time, such as every 256 ms. Only word lines and memory cells in word lines, respectively, containing bad memory cells are refreshed with a cycle time of 64 ms.

Since the bad memory cells and the memory cells with a short retention time, respectively, are disposed at a different position in each memory element chip, it has to be possible to adjust and store, respectively, individually, which word lines and memory cells of which word lines, respectively, should experience a fast and frequent, respectively, refresh. Therefore, laser fuses and fusing means, respectively, are used, which can be fuse-blown via a laser beam to break an electrical connection. Via a respective number of laser fuses one word line address can be adjusted, respectively. A comparator compares in each refresh signal the applied address with the one or the ones programmed with the laser fuses. If the applied and one of the programmed word line addresses match, a refresh for the memory cells of the respective word line is arranged. Additionally, it can be determined with an enable bit, whether a word line should be operated with a short refresh cycle time at all.

Preferably, only the address of the address bus will be illustrated with laser fuses and not each individual word line. For example, each address of a total of 512 word lines, can be illustrated by nine laser fuses. Therefore, the use of an enable laser fuse is practical. If the addresses of several word lines are to be storable, to set same to a short retention time, a respective multiple number of laser fuses or the entire circuit have to be present and built in correspondingly often, respectively.

According to the present invention, it is achieved that electrical power for the refresh of memory cells, which do not yet have to be refreshed, is saved. The total power requirement of the memory element in the refresh mode is therefore reduced significantly.

BRIEF DESCRIPTION OF THE DRAWINGS

Below, preferred embodiments of the present invention will be discussed in more detail with reference to the accompanying drawings, in which FIG. 1 a schematical representation of a preferred embodiment of the present invention.

DESCRIPTION OF THE PREFERRED EMBODIMENTS

Figure 1:
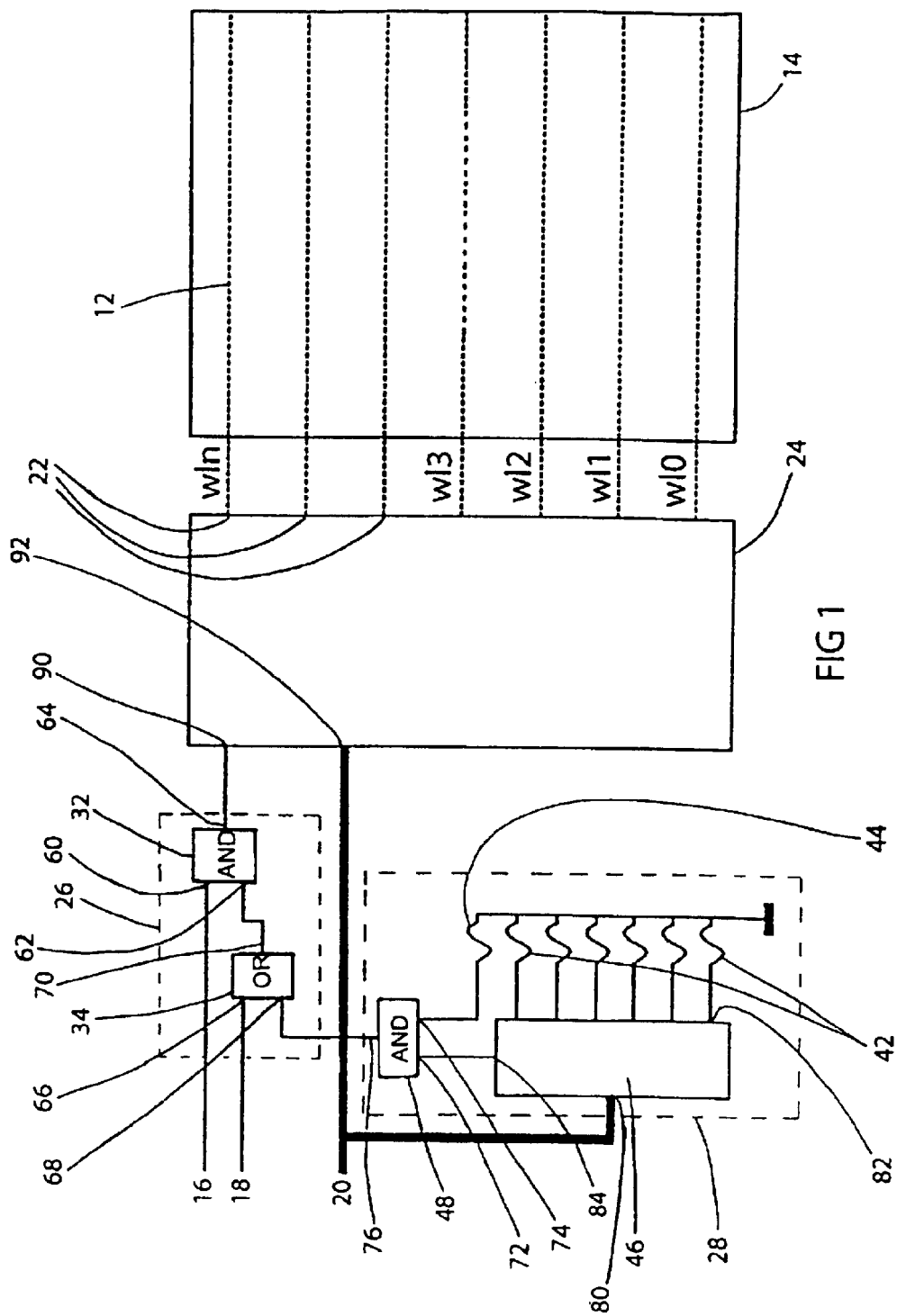

FIG. 1 is a schematical representation of an apparatus for refreshing a plurality of memory cells 12 in a memory element 14. The apparatus comprises an input 16 for receiving a clock signal, an input 18 for receiving an enable signal, an input 20 for receiving an address signal and a plurality of activating outputs 22. Each of the plurality of activation outputs is connected to one of a plurality of word lines and activation lines, wl0, wl1, . . . , wln, respectively, wherein a number of memory cells 12 of the memory element 14 is associated with each activation line wl0, wl1, . . . , wln. Further, the apparatus comprises a refresh circuit 24 for refreshing the memory cells 12 in the memory element 14, means 26 for applying a clock signal to the refresh circuit 24 and means 28 for determining, whether a selected activation line wl0, wl1, . . . , wln has to be refreshed when reaching a first retention time or when reaching a second retention time.

The input 20 is connected to an address bus, which is not illustrated. Preferably, the address bus and thus the input 20 has a plurality of parallel electrical lines, and the address signal consists of a corresponding plurality of (binary) electrical signals on the plurality of electrical lines, that are transmitted and received in parallel. If, for example, $512=2^9$ activation lines wl0, wl1, . . . , wl511 exist, the address bus has nine electrical lines, and the address signal consists of nine binary electrical signals that are transmitted in parallel via the electrical lines of the address bus.

Means 28 receives an address signal and determines whether a word line determined by the address signal comprises memory cells of a first type requiring a short retention time, which means a frequent refresh, or whether a word line determined by the address signal exclusively comprises memory cells of the second type having a long retention time. Means 28 generates a respective control signal for means 26.

Depending on the enable signal and the control signal generated by means 26, means 26 applies the control signal to the refresh circuit 24 or not. If the control signal indicates that the word line comprises at least one memory cell of the first type the clock signal will be applied to the refresh circuit 24, independent of the state of the enable signal. If the control signal indicates that the selected word line comprises only memory cells of the second type, the clock signal will only be applied to the refresh circuit 24 when the enable signal indicates that a refresh of all memory cells is necessary.

Means 26 for applying a clock signal to the refresh circuit 24 comprises an AND gate 32 with a first input 60 connected to input 16 for receiving the clock signal, a second input 62 and an output 64. Further, an OR gate 34 is provided, comprising a first input 66 connected to input 16 for receiving the enable signal, a second input 68 and an output 70 connected to the second input 62 of the AND gate 32.

Means 28 for determining also comprises an AND gate 48 with a first input 72, a second input 74 and an output 76 connected to the second input 68 of the OR gate 34 of means 26. Means 28 further comprises a comparator 46 with an address signal input 80 connected to the input 20 for receiving the address signal, a plurality of memory terminals 82 and an output 84 connected to the first input 72 of the AND gate 48.

To identify a word line via the associated address signal in the embodiment, means 28 comprises a plurality of laser fuses 42, by way of which an address can be programmed and stored, respectively, in a word line. This address is applied to the memory terminals 82. A further laser fuse 44 is provided to generate an activation signal applied to the second input 74 of the AND gate 48, indicating whether an activation line with the first retention time is present, i.e. is programmed by the laser fuses 42 or not.

In FIG. 1, n+1 activation lines wl0, wl1, . . . , wln are shown in the memory element 14. The activation lines are selected via the address bus, whose width depends on the number of activation lines. The number of fuses 42 necessary for programming an address equals the width of the address buses. For n+1 activation lines wl0, wl1, . . . , wln, the width of the bus equals $\log_2(n+1)$, when n=511, which means 512 word lines, the address bus is nine bits wide, so that nine laser fuses would be required. In FIG. 1 the fuses are merely shown schematically.

The refresh circuit 24 comprises a clock signal input 90, connected to the output of AND gate 32 of means 26, an address signal input 92, connected to the input 20 for receiving the address signal parallel to the address signal input 80 of the comparator 46, and a plurality of activation outputs 22.

In the production of a memory element 14, after generating the memory cells 12, all memory cells 12 are tested regarding to their retention times, within which a content of memory cell can be read out correctly from a memory cell again, after writing or refreshing same. Thereby, it is assumed that each memory cell 12 can hold its content at least for the duration of a first, predetermined retention time. Most memory cells 12 can, however, hold their content at least for the duration of a second predetermined retention time, which is longer than the first retention time. The memory cells 12 are divided into a first number of memory cells, which can hold their content at least during the first retention time, but not until the end of the second retention time, and a second number of memory cells, which can hold their content at least until the end of the second retention time after storing or refreshing the content. For every individual activation line wl0, wl1, . . . , wln it is determined whether at least one memory cell of the first number of memory cells is associated with it, or whether all memory cells associated with it belong to the second number of memory cells, which can hold their content during the longer second retention time. For the embodiment illustrated in FIG. 1, it is assumed that the activation line wl2 has memory cells with a short retention time. The addresses of the activation line wl2 are permanently programmed by the laser fuses 42. The laser fuse 44 stores the activation signal as enable bit, which indicates whether an activation line exists, to which at least one memory cell from the first number of memory cells is associated.

The mode of operation of the circuit of FIG. 1 is discussed in more detail below. The comparator 46 receives the address signal applied to its input 20 via its address signal input 80 and compares it with the address, which is programmed by the laser fuses 42. When the address signal matches the programmed address, the comparator 46 provides a signal at its output 84 corresponding to a logical one, otherwise, the comparator 46 generates a signal at its output 84 corresponding to a logical zero. The signal generated by the comparator 46 at its output 84 is compared by the AND gate 48 to the activation signal generated by the laser fuse 44. When the activation signal indicates that at least one memory cell of the first number of memory cells is associated with one of the activation lines wl0, wl1, . . . , wln, and the comparator determines that the address signal applied at the input 20 matches the stored address, the AND gate 48 generates a control signal corresponding to a logical one at its output 66.

Figure 2:
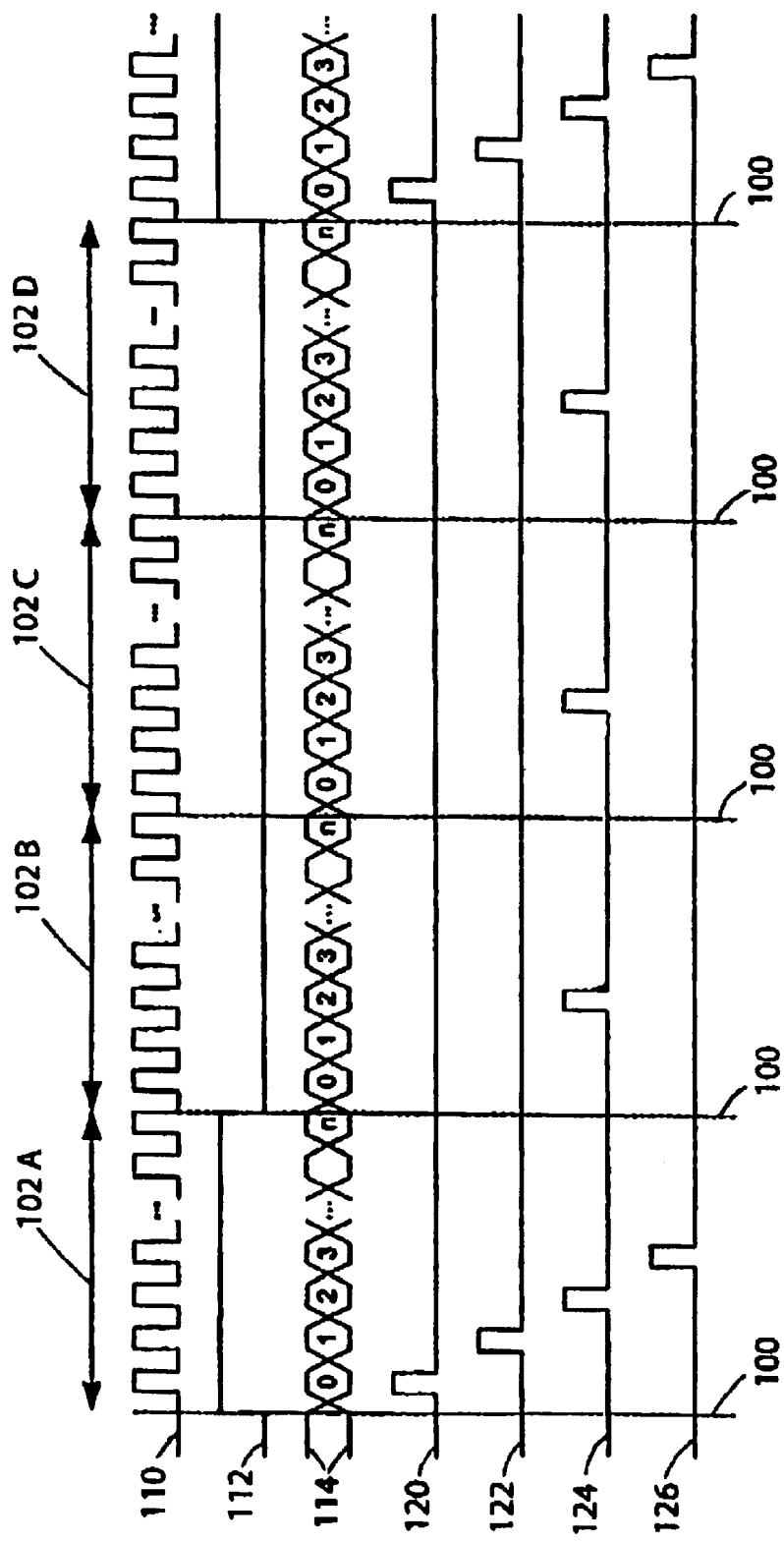
FIG. 2 a schematical representation of the levels of different signals in the apparatus of the embodiment of FIG. 1.

For a further discussion of the function of the embodiment, reference will be made below to FIG. 2, illustrating schematically the wave forms of different signals at the apparatus of FIG. 1. In FIG. 2, the time is plotted to the right, wherein the distance of two vertical dotted lines 100 corresponds to the first retention time illustrated by arrows 102. The omission marks in the first and third line of the diagram indicate that for a better clarity only some of the periodical wave forms are illustrated.

In the top line of FIG. 2, curve 110 illustrates the wave form of the clock signal, which is applied to the first input 60 of the AND gate 32 via input 16. In the second line, curve 112 shows the wave form of the enable signal, which is applied to the first input 66 of the OR gate 34 via input 18. The curves 114 schematically show the wave forms of the address signal applied via the input 20 to the address signal input 80 of the comparator 46 and to the address signal input 92 of the refresh circuit 24. During a time interval of the length of the first retention time illustrated by one of arrows 102a, 102b, 102c, 102d, the address signal passes through all n+1 addresses of the n+1 activation lines wl0–wln. In the numerical example illustrated above, n=511, wherein only the first four and the last two address signals are illustrated. Each time, when the address signal 114 corresponds to one of the n+1 addresses, the clock signal 110 enters a state corresponding to the logical one, and inbetween a state corresponding to the logical zero.

In this embodiment, the clock cycle of the enable signal 112 is four times as long as the first retention time. During the time interval illustrated by arrow 102a, wherein the address signal 114 passes through all addresses 0 to n once, the enable signal 112 represents a logical zero. During the time intervals illustrated by arrows 102b, 102c, 102d, wherein the address signal 114 passes all addresses from 0 to n three times, the value of the enable signal 112 is a logical zero. Afterwards, the waveform of the enable signal 112 repeats.

In the last four lines of FIG. 2, signals 120, 122, 124, 126 are illustrated, which the refresh circuit 24 applies to the first four activation lines wl0–wl3. In the illustrated example, exclusively memory cells from the second number of memory cells are associated with the activation lines wl0, wl1, and wl3, while at least one memory cell from the first number of memory cells is associated with the activation line wl2. Accordingly, the address of the activation line wl2 is stored and programmed, respectively, in the laser fuses 42. The laser fuse 44 is programmed so that it indicates that a memory cell 12 of the first number of memory cells is associated with at least one of the activation lines wl0–wln.

In the first time interval 102a, the enable signal 112 applied to the first input 66 of the OR gate 44 via the input 18 represents a logical one. Therefore, at the output 70 of the OR gate 34 and thus at the second input 62 of the AND gate 32, during the first time interval 102a, always a logical one is applied, independent of the control signal generated by the AND gate 48. Accordingly, the clock signal applied at the first input 60 of the AND gate 32 via the input 16 is applied to output 64 of the AND gate 32 and to the clock signal input 90 of the refresh circuit 24. The refresh circuit 24 generates a refresh signal at that activation output 22, whose address matches the address momentarily applied via the input 20 to the address signal 92, when it receives the clock signal at the clock signal input 90 simultaneously. The refresh signal causes the required actions for refreshing the memory cells associated with the activation line.

In the following time intervals 102b, 102c, 102d, the enable signal 112 applied to the first input of the OR gate 34 via the input 18 corresponds to a logical zero. The output signal of output 70 of the OR gate 34 applied to the second input 62 of the AND gate 32 therefore depends on the control signal generated by output 76 of the AND gate 48. As mentioned above, the control signal corresponds to a logical one, when an address of an activation line is applied to input 20, to which a memory cell of the first plurality of memory cells is associated. The control signal corresponds to a logical zero when an address of an activation line is applied to input 20, to which no memory cell from the first number of memory cells is associated.

Since only the address of the activation line wl2 is programmed in the laser fuses 42, the control signal applied to the second input 36 of the OR gate 34 is thus always zero, when the address signal 114 does not correspond to the address 2. Thus, the signal applied to second input 62 of the AND gate 32 is also zero and the clock signal is suppressed, which means not passed on to the refresh circuit 24, when the address signal 114 does not correspond to the address 2. The signals 120, 122, 126 generated on the activation lines wl0, wl1 and wl3 by the refresh circuit 24 are therefore zero during time intervals 102b, 102c, 102d and contain no refresh signals.

When the address signal 114 corresponds to the address of the activation line wl2, the comparator 46 generates a logical one at its output 84. Since the laser fuse 44 also generates a logical one, the control signal generated by the AND gate 48 at its output 76 is also a logical one. Therefore, in this case, a logical one is applied to the output 70 of the OR gate 34 and thus also to the second input 62 of the AND gate 34, independent of the state of the enable signal 112 to the first input 66 of the OR gate 34. Accordingly, the first clock signal applied to the first input 60 of the AND gate 32 via input 16 is output by the AND gate 32 at the output 64 of the AND gate 32. Therefore, the refresh circuit 24 receives the clock signal at the clock signal input 90 and generates a refresh signal on the activation line wl2.

Instead of the laser fuses 42, 44 of the illustrated embodiment, addresses of activation lines, to which memory cells are associated, which have the shorter first retention time, can be stored in any other way. Further, it is possible to define not only a first and a second retention time and to divide memory cells correspondingly into a first plurality and a second plurality, but to carry out a finer subdivision, whereby a better matching of the refresh periods to the respective maximum possible retention time of the memory cells associated with an activation line is possible. With an increased circuit technical effort, a further improvement of energy saving is possible.

The above example makes it possible to establish an address. Thus, it can be applied in all cases where only one activation line and word line, respectively, has memory cells with a short retention time. In cases, where several activation lines have memory cells with a short retention time, the circuit is correspondingly required multiple times. Instead of using several circuits, however, the circuit can be designed so that several addresses can be stored.

The inventive apparatus can be integrated in any memory element, wherein the activation lines can for example be the word lines and the refresh circuit 24 can be integrated partly or fully with a line decoder. Alternatively, the inventive apparatus could also be designed outside the memory element on a separate chip or in the shape of a separate electronic device.

| Reference Number List | |
|---|---|
| 12 | memory cell |
| 14 | memory element |
| 16 | input for receiving a clock signal |
| 18 | input for receiving an enable signal |
| 20 | input for receiving an address signal |
| 22 | activation output |
| 24 | refresh circuit |
| 26 | means for applying |
| 28 | means for determining |
| 32 | AND gate of means 26 for applying |
| 34 | OR gate |
| 42 | laser fuse |
| 44 | laser fuse |
| 46 | comparator |
| 48 | AND gate of means 28 for determining |
| 60 | first input of AND gate 32 |

-continued

Reference Number List

| | |
|---|---|
| 62 | second input of AND gate 32 |
| 64 | output of AND gate 32 |
| 66 | first input of OR gate 34 |
| 68 | second input of OR gate 34 |
| 70 | output of OR gate 34 |
| 72 | first input of further AND gate 46 |
| 74 | second input of further AND gate 46 |
| 76 | output of further AND gate 46 |
| 80 | address signal input of comparator 44 |
| 82 | laser fuse terminal |
| 84 | output |
| 90 | clock signal input of refresh circuit 50 |
| 92 | address signal input of refresh circuit 50 |
| 100 | vertical dotted line |
| 102 | time interval |
| 110 | clock signal |
| 112 | enable signal |
| 114 | address signal |
| 120,122,124,126 | signal |

What is claimed is:

1. A method for refreshing a plurality of memory cells in a memory element, wherein a first plurality of memory cells has a first retention time for holding a content of the memory cell, and wherein a second number of memory cells has a second retention time for holding the content of the memory cell, wherein the first retention time is shorter than the second retention time, wherein the memory element has a plurality of activation lines, and wherein each activation line has associated therewith a plurality of memory cells, the method comprising the steps of:

receiving a clock signal having a clock cycle being equal to the first retention time divided by the plurality of activation lines;

receiving an enable signal having a clock cycle corresponding to the second retention time, the enable signal indicating whether all activation lines are to be refreshed;

receiving an address signal for selecting one the activation lines;

depending on the received address signal, determining if at least one memory cell of the first plurality of memory cells is associated with the selected activation line;

when at least one memory cell of the first plurality of memory cells is associated with the selected activation line, independent of the enable signal, applying the clock signal and the address of the selected activation line to a refresh circuit for generating a refresh signal for the plurality of memory cells associated with the selected activation line;

when no memory cell of the first plurality of memory cells is associated with the selected activation line and the enable signal indicates that all activation lines are to be refreshed, applying the clock signal and the address of the selected activation line to the refresh circuit for generating a refresh signal for the plurality of memory cells associated with the selected activation line; and when no memory cell of the first plurality of memory cells is associated with the selected activation line and the enable signal indicates that not all activation lines are to be refreshed, suppressing the clock signal so that the refresh circuit generates no refresh signal for the selected activation line.

2. A method according to claim 1, further comprising the steps of:

for each of the activation lines of the memory element, storing the respectively associated retention time.

3. An apparatus for refreshing a plurality of memory cells in a memory element, wherein a first number of memory cells has a first retention time for holding a content of each of the first number of memory cells, and wherein a second number of memory cells has a second retention time for holding a content of each of the second number of memory cells, and wherein the first retention time is shorter than the second retention time, the apparatus comprising:

a plurality of activation lines and a plurality of memory cells being associated with each said activation line;

a clock input for receiving a clock signal with a clock cycle being equal to the first retention time divided by the number of said activation lines;

an enable input for receiving an enable signal having a clock cycle corresponding to the second retention time, the enable signal indicating if all of said activation lines are to be refreshed;

an address input for receiving an address signal for selecting one of said activation lines;

first logic means for determining if at least one memory cell of said first plurality of memory cells is associated with said selected activation line;

a refresh circuit having an address input for receiving the address signal, a clock signal input for receiving the clock signal and a plurality of activation outputs each being connected to one of said activation lines, for generating a refresh signal for said plurality of memory cells associated with said activation line selected by the address signal depending on a clock signal applied to the clock signal input; and second logic means for applying the clock signal to the clock signal input of said refresh circuit independently of an enable signal, when at least one memory cell of said first plurality of memory cells is associated with said selected activation line, for applying the clock signal to the clock signal input of said refresh circuit, when no memory cell of said first plurality of memory cells is associated with said selected activation line and the enable signal indicates that all of said activation lines are to be refreshed, and for suppressing the clock signal when no memory cell of said first plurality of memory cells is associated with said selected activation line and the enable signal indicates that all of said activation lines are to be refreshed.

4. An apparatus according to claim 3, wherein the first logic means comprises a memory for storing each address signal if at least one memory cell of the first plurality of memory cells is associated with the activation line selected by the address signal, and a comparator connected to the at least one memory and having an address signal input and a control signal output; and the second logic means comprises an AND gate having a first input, a second input and an output and an OR gate having a first input, a second input and an output, wherein the first input of the AND gate is connected to the clock input, the first input of the OR gate is connected to the enable input, the second input of the AND gate is connected to the output of the OR gate, the second input of the OR gate is connected to the control signal output of the comparator of the first logic means and the output of the AND gate is connected to the clock signal input of the refresh circuit.

5. An apparatus according to claim 4, wherein the first logic means comprises an AND gate having a first input connected to the control signal output of the comparator, a second input receiving an activation signal, which indicates if an activation line exists with which at least one memory cell of the first plurality of memory cells is associated, and an output connected to the second input of the OR gate of the second logic means.

6. An apparatus according to claim 4, wherein the memory comprises a plurality of fuses for indicating which of the plurality of activation lines the first retention time is associated with, wherein the activation signal is generated by a further fuse.

* * * * *